(12) United States Patent
Wu

(10) Patent No.: US 9,768,412 B2
(45) Date of Patent: Sep. 19, 2017

(54) COMPOSITION USEFUL AS AN ORGANIC WATER/OXYGEN BARRIER MATERIAL, OLED DISPLAY DEVICE AND MANUFACTURING METHOD THEREOF

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Haidong Wu, Beijing (CN)

(73) Assignees: BOE TECHNOLOGY GROUP CO., LTD., Beijing (CN); ORDOS YUANSHENG OPTOELECTRONICS TECHNOLOGY CO., LTD., Ordos, Inner Mongolia (CN)

( * ) Notice: Subject to any disclaimer, the term of this patent is extended or adjusted under 35 U.S.C. 154(b) by 126 days.

(21) Appl. No.: 14/892,295

(22) PCT Filed: Jun. 8, 2015

(86) PCT No.: PCT/CN2015/080980
§ 371 (c)(1),
(2) Date: Nov. 19, 2015

(87) PCT Pub. No.: WO2015/192723
PCT Pub. Date: Dec. 23, 2015

(65) Prior Publication Data
US 2016/0181569 A1   Jun. 23, 2016

(30) Foreign Application Priority Data
Jun. 16, 2014   (CN) .......................... 2014 1 0268704

(51) Int. Cl.
*H01L 51/52* (2006.01)
*C08L 65/04* (2006.01)
(Continued)

(52) U.S. Cl.
CPC .......... *H01L 51/5253* (2013.01); *C08L 65/04* (2013.01); *C08L 67/00* (2013.01);
(Continued)

(58) Field of Classification Search
CPC .......... H01L 2251/558; H01L 51/0035; H01L 51/004; H01L 51/524
See application file for complete search history.

(56) References Cited

U.S. PATENT DOCUMENTS

2005/0218803 A1   10/2005   Takeuchi et al.
2007/0007893 A1   1/2007    Shin et al.
(Continued)

FOREIGN PATENT DOCUMENTS

CN   1678151 A   10/2005
CN   1893102 A   1/2007
(Continued)

OTHER PUBLICATIONS

International Search Report and Written Opinion both dated Sep. 2, 2015; PCT/CN2015/080980.

*Primary Examiner* — Eliseo Ramos Feliciano
*Assistant Examiner* — Joannie A Garcia
(74) *Attorney, Agent, or Firm* — Ladas & Parry LLP; Loren K. Thompson

(57) ABSTRACT

A composition which can be used as an organic water/oxygen barrier material, an OLED display device and manufacturing method thereof are disclosed. The composition includes: 15-25 wt % of parylene, 15-25 wt % of polyvinyl chloride, 5-15 wt % of acetone, 5-15 wt % of trichloroethylene, 10-20 wt % of polyvinyl acetate, 5-15 wt % of
(Continued)

polyvinyl alcohol, 0-5 wt % of $SiO_2$ nanoparticles, and 8-12 wt % of an organic solvent, wherein all weight percent values are based on the total weight of the composition. When a water/oxygen barrier layer fabricated by the composition is disposed between a luminescent layer of OLED and a light extraction layer, water vapor and oxygen gas can be prevented from entering the OLED luminescent layer, thereby prolonging the service life of the OLED luminescent layer.

20 Claims, 2 Drawing Sheets

(51) Int. Cl.
C08L 67/00 (2006.01)
C09D 127/06 (2006.01)
C09D 165/04 (2006.01)
H01L 51/00 (2006.01)

(52) U.S. Cl.
CPC ......... *C09D 127/06* (2013.01); *C09D 165/04* (2013.01); *H01L 51/004* (2013.01); *H01L 51/0035* (2013.01); C08G 2261/3424 (2013.01); C08G 2261/95 (2013.01); C08L 2205/02 (2013.01); C08L 2205/035 (2013.01); *H01L 51/524* (2013.01); *H01L 51/5262* (2013.01); H01L 2251/5369 (2013.01); H01L 2251/558 (2013.01)

(56) References Cited

U.S. PATENT DOCUMENTS

| | | |
|---|---|---|
| 2007/0219375 A1 | 9/2007 | Fujiyama et al. |
| 2010/0286496 A1* | 11/2010 | Simpson ............ A61B 5/14532 600/347 |
| 2013/0129992 A1* | 5/2013 | Jahromi .................. B41M 3/00 428/201 |
| 2013/0328479 A1 | 12/2013 | Jung et al. |
| 2013/0333758 A1 | 12/2013 | Okabe et al. |
| 2013/0334504 A1 | 12/2013 | Thompson et al. |
| 2014/0071653 A1 | 3/2014 | Thompson et al. |

FOREIGN PATENT DOCUMENTS

| | | |
|---|---|---|
| CN | 1938321 A | 3/2007 |
| CN | 101183707 A | 5/2008 |
| CN | 102024841 A | 4/2011 |
| CN | 103489888 A | 1/2014 |
| CN | 103502855 A | 1/2014 |
| CN | 203466226 U | 3/2014 |
| CN | 104051671 A | 9/2014 |
| CN | 203895509 U | 10/2014 |
| WO | 2009/090423 A1 | 7/2009 |
| WO | 2012/102390 A1 | 8/2012 |
| WO | 2012/106184 A2 | 8/2012 |

* cited by examiner

Light rays exiting direction

COMPOSITION USEFUL AS AN ORGANIC WATER/OXYGEN BARRIER MATERIAL, OLED DISPLAY DEVICE AND MANUFACTURING METHOD THEREOF

TECHNICAL FIELD

At least one embodiment of the present invention relates to a composition useful as an organic water/oxygen barrier material, an OLED display device and a manufacturing method thereof.

BACKGROUND

An Organic Light-emitting Display (OLED) has become a new flat panel display device researched and developed in recent years by virtue of its merits of high brightness, wide viewing angle, active luminescence, high contrast, ultrathin, portability and so on.

The packaging technology of an OLED display panel is a key process to raise the lifetime of an OLED display device, and this is because the main reasons affecting the lifetime of the OLED display device are as follows: 1) a cathode of the OLED display panel usually adopts a metal with a lower work function, and so, when $H_2O$ and $O_2$ are present, $H_2O$ and $O_2$ may react with the metal, and this leads to protuberance of the cathode and degradation in the device performance; 2) $O_2$ is a triplet quencher itself, and moreover an organic luminescent material is oxidized by $O_2$ to generate a carbonyl compound (black spots), which may lead to significant reduction in luminescent quantum efficiency; 3) other organic functional material in an OLED luminescent layer may also be oxidized by $O_2$, resulting in deterioration in the performance of the OLED display device. Therefore, it is necessary to research and develop an effective packaging technology for blocking (or preventing) $H_2O$ and $O_2$.

At present, a packaging mode with good packaging effect is glass frit encapsulation, and a commonly used packaging structure is that a light extraction layer is directly provided on a surface of an OLED luminescent layer.

SUMMARY

According to at least one embodiment of the present invention, there are provided a composition useful as an organic water/oxygen barrier material, an OLED display device and a manufacturing method thereof, for preventing water vapor (moisture) and oxygen gas from entering an OLED luminescent layer, and then prolonging the service life of the OLED display device.

According to at least one embodiment of the invention, there is provide a composition comprising: 15-25 wt % of parylene, 15-25 wt % of polyvinyl chloride, 5-15 wt % of acetone, 5-15 wt % of trichloroethylene, 10-20 wt % of polyvinyl acetate, 5-15 wt % of polyvinyl alcohol, 0-5 wt % of $SiO_2$ nanoparticles, and 8-12 wt % of an organic solvent, wherein all weight percent values are based on the total weight of the composition. The composition is useful as an organic water/oxygen barrier material.

According to at least one embodiment of the invention, there is provided an OLED display device, which is provided with a water/oxygen barrier layer between an OLED luminescent layer and a light extraction layer, the water/oxygen barrier layer being formed by using the above composition.

According to at least one embodiment of the invention, there is further provided a manufacturing method of an OLED display device, which includes: forming an OLED luminescent layer on a back panel; forming a water/oxygen barrier layer on a light exiting side of the OLED luminescent layer; forming a light extraction layer on a light exiting side of the water/oxygen barrier layer; conducting encapsulation. The water/oxygen barrier layer is formed by using the composition as described above.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

Figure 1:
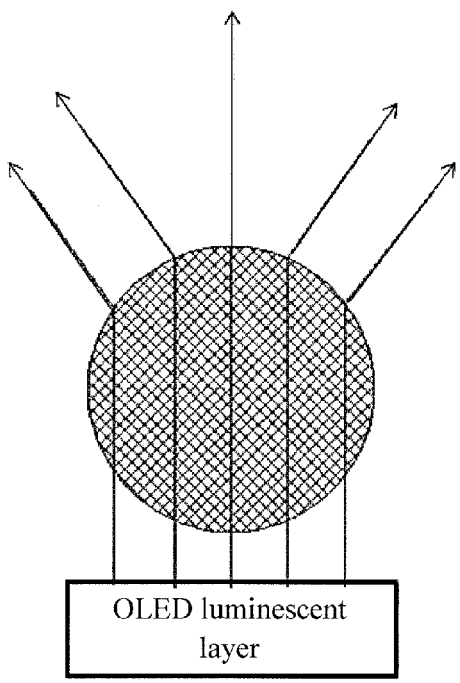
FIG. 1 is a schematic view illustrating scattering function of $SiO_2$ nanoparticles on light rays.

REFERENCE NUMERALS 1 denotes a glass substrate, 2 denotes a back panel, 3 denotes a glass frit, 4 denotes an anode ITO, 5 denotes an OLED luminescent layer, 6 denotes a metal cathode, 7 denotes a water/oxygen barrier layer, 8 denotes a light extraction layer, 9 denotes a concave cover plate

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

It has been noticed by inventor(s) of the present application that, glass has a favorably barrier effect to water vapor and oxygen gas, but because the barrier property of glass frit to water vapor and oxygen gas is far below the barrier property of glass, and for glass frit packaging mode, micro cracks and air bubbles are easily produced during encapsulation, these lead to degradation in water/oxygen barrier performance. After water and oxygen go inside an OLED luminescent layer, they may create chemical reactions with a metal and an organic material inside the OLED luminescent layer, thereby resulting in deterioration of the device performance, and leading to occurrence of black spots. Therefore, those skilled in the art hope that a display device capable of impeding the permeation of water vapor and oxygen gas into an OLED luminescent layer is provided.

According to at least one embodiment of the invention, there is provided a composition comprising: 15-25 wt % of parylene, 15-25 wt % of polyvinyl chloride, 5-15 wt % of acetone, 5-15 wt % of trichloroethylene, 10-20 wt % of polyvinyl acetate, 5-15 wt % of polyvinyl alcohol, 0-5 wt % of $SiO_2$ nanoparticles, and 8-12 wt % of an organic solvent, wherein all weight percent values are based on the total weight of the composition. An organic water/oxygen barrier material produced by using the composition has the merits of extremely high water/oxygen barrier performance, wide raw material sources, low price, being easy to be prepared, and so on. In some embodiments of the invention, the polymer (such as parylene, polyvinyl chloride, polyvinyl acetate, and polyvinyl alcohol) in the composition may have a molecular weight of 3000 to 500000 Dalton, or 5000 to 50000 Dalton.

Percentages in embodiments of the invention are each percentages by weight if no special instructions.

In various embodiments, the composition comprises 3 to 5 wt % of $SiO_2$ nanoparticles.

In various embodiments, the organic solvent is isopropanol or ethyl acetate.

In various embodiments, the average particle diameter of the $SiO_2$ nanoparticles is smaller than or equal to 50 nm, such as, 30 nm. When the average particle diameter of the $SiO_2$ nanoparticles falls within this scope, it can be ensured that the composition can be formed into a film evenly. Furthermore, when it is applied in some fields, such as, for preventing water and oxygen from entering an OLED luminescent layer in an OLED display device, the light extraction efficiency of the OLED luminescent layer can also be enhanced.

The composition as stated in embodiments of the invention can be applied to many situations where barrier to water and oxygen is required, which include but are not limited to applying to an OLED display device, such as, for protection of an OLED luminescent layer.

Embodiments

In the following embodiments of the present invention, the following raw materials are used, other raw materials are conventional or commercially available from the market:

(Water Vapor Transmission Rate) is calculated, and then Multi-channel test system on the reliability of the T6000 Encapsulation Test System is used to do the valuation.

$$WVTR[g/m^2 \cdot day] = -2(18/40.1) \times 1.55 \ g/cm^3 \times 3.4 \times 10^{-8} [d(1/R)/dt] \times (S_{Ca}/S)$$

R: electric resistance; t: time; $S_{Ca}$: the area of the Ca film; S: the area of the encapsulated film Lifetime of a Device OLED Lifetime Test System from Nanjing Bosheyonghuai Electronic Technology Co., Ltd. is used in this test.

Test method: the current density of the device is 10 $mA/cm^2$, the brightness is measured every 5 min over 13 hours, when the brightness drops to 95% of the initial brightness, the time is recorded which is the LT95 lifetime of the device;

Brightness

OLED I-V-L Test System from Nanjing Bosheyonghuai Electronic Technology Co., Ltd. is used in this test.

Test method: Recording the brightness of the device when the current density is 10 $mA/cm^2$.

Current Efficiency

OLED I-V-L Test System from Nanjing Bosheyonghuai Electronic Technology Co., Ltd. is used in this test.

Test method: Recording the brightness of the device when the current density is 10 $mA/cm^2$.

Current efficiency=Brightness/Current Density

Color Uniformity

OLED I-V-L Test System from Nanjing Bosheyonghuai Electronic Technology Co., Ltd. is used in this test.

Test method: The color coordinates of a edge position and a center position of the device is measured, and then the color uniformity is determined.

TABLE 1

| Raw Material | Source | Properties |
| --- | --- | --- |
| parylene | Baiteng Technology (SuZhou) Co., Ltd., POLYXYLENE | Purity: 99%; colorless powder; relative density: 1.103~1.289 |
| polyvinyl chloride | SuZhou Haoshengyi Plasticization Co., Ltd., Polyvinyl Chloride | Molecular weight: 50000 to 120000; white amorphous powder |
| acetone | Dongguan Jiashun Chemcial Co., Ltd., Acetone | Purity: >98% Formula: $CH_3COCH_3$ Molecular weight: 58.08 |
| trichloroethylene | Jinan Maixiang Trading Co., Ltd., Trichloroethylene | Purity: >99% Formula: $C_2HCl_3$ Molecular weight: 131 |
| polyvinyl acetate | Changsha Yufenghuabo Instrument Co., Ltd., Polyvinyl Acetate | Purity: >99% Formula: $[CH_2CHCOOCH_3]_n$ Melting Point: 60° C. Density: 1.19 |
| polyvinyl alcohol | Anhuiwanwei High-tech material Limited by Share Ltd, PVA | Purity: >99% Formula: $(C_2H_3OH)n$ |
| $SiO_2$ nanoparticles | Nanjing Tianxing New material Co., Ltd., Nano silica $SiO_2$ | White powder |
| isopropanol | Jinan Jisheng Chemical Co., Ltd., Isopropanol | Purity: >99% Formula: $C_3H_8O$ Molecular weight: 60.1 |

Test

When testing the properties in the present invention, the following testing methods are used.

Water Vapor Transmittance

T6000 Encapsulation Test System from Nanjing Bosheyonghuai Electronic Technology Co., Ltd. is used in this test.

Testing method: After depositing Calcium on a substrate of a prepared device, the changing of the electric resistance of the device over prolonged period is tested, the WVTR Visible Angle OLED I-V-L Test System from Nanjing Bosheyonghuai Electronic Technology Co., Ltd. is used in this test.

Test method: Test angle may be ±80°. When Δuv=0.05 under a test angle, then the test angle is the visible angle of the device.

Embodiment 1

The present embodiment relates to a composition useful as an organic water/oxygen barrier material, which is made of a composition comprising: parylene (20 wt %), polyvinyl chloride (20 wt %), acetone (10 wt %), trichloroethylene (10 wt %), polyvinyl acetate (15 wt %), polyvinyl alcohol (10 wt %), $SiO_2$ nanoparticles (3 wt %) and isopropanol as an organic solvent (10 wt %).

In an example of the embodiment, the average particle diameter of $SiO_2$ nanoparticles is 30 nm.

Embodiment 2

The present embodiment relates to a composition useful as an organic water/oxygen barrier material, which is made of a composition comprising: parylene (15 wt %), polyvinyl chloride (15 wt %), acetone (5 wt %), trichloroethylene (5 wt %), polyvinyl acetate (10 wt %), polyvinyl alcohol (5 wt %), $SiO_2$ nanoparticles (5 wt %) and ethyl acetate as an organic solvent (8 wt %).

In an example of the embodiment, the average particle diameter of $SiO_2$ nanoparticles is 40 nm.

Embodiment 3

The present embodiment relates to a composition useful as an organic water/oxygen barrier material, which is made of a composition comprising: parylene (25 wt %), polyvinyl chloride (25 wt %), acetone (5 wt %), trichloroethylene (5 wt %), polyvinyl acetate (15 wt %), polyvinyl alcohol (10 wt %), $SiO_2$ nanoparticles (3 wt %) and ethyl acetate as an organic solvent (12 wt %).

In an example of the embodiment, the average particle diameter of $SiO_2$ nanoparticles is 50 nm.

Embodiment 4

The present embodiment relates to a composition useful as an organic water/oxygen barrier material, which is made of a composition comprising: parylene (15 wt %), polyvinyl chloride (25 wt %), acetone (5 wt %), trichloroethylene (15 wt %), polyvinyl acetate (10 wt %), polyvinyl alcohol (15 wt %), $SiO_2$ nanoparticles (4 wt %) and ethyl acetate as an organic solvent (8 wt %).

In an example of the embodiment, the average particle diameter of $SiO_2$ nanoparticles is 30 nm.

Embodiment 5

The present embodiment relates to a composition useful as an organic water/oxygen barrier material, which is made of a composition comprising: parylene (25 wt %), polyvinyl chloride (15 wt %), acetone (15 wt %), trichloroethylene (5 wt %), polyvinyl acetate (20 wt %), polyvinyl alcohol (10 wt %), and isopropanol as an organic solvent (10 wt %).

In an example of the embodiment, the average particle diameter of $SiO_2$ nanoparticles may be 45 nm.

It is to be noted that, the aforementioned embodiments are merely for exemplary explanation, but embodiments of the invention are not limited thereto. For example, some impurities may also be included in the composition. For example, the average particle diameter of $SiO_2$ nanoparticles may be smaller than 30 nm as well, as long as such a function that the composition is formed into a film evenly or light rays are scattered so as to improve the light extraction efficiency can be served. Additionally, $SiO_2$ nanoparticles may take the shape of power.

In order to enhance the barrier ability of the OLED luminescent layer to water and oxygen, an OLED display device is provided by at least one embodiment of the invention. By means of adding a water/oxygen barrier layer (which includes but is not limited to that formed from the composition useful as an organic water/oxygen barrier material) to a light exiting side of the OLED luminescent layer, an improvement of lifetime of the OLED luminescent layer is achieved.

According to at least one embodiment of the invention, there is provided an OLED display device, which is provided with a water/oxygen barrier layer between an OLED luminescent layer and a light extraction layer.

In an embodiment, the water/oxygen barrier layer may be formed by using the aforementioned composition useful as an organic water/oxygen barrier material.

In an embodiment, the water/oxygen barrier layer may also be formed by a material known by those skilled in the art. It can be understood by those skilled in the art that, if a layered structure has a property of blocking water and oxygen, it can be used for implementing the present invention.

No improvement is made to other structures (e.g. a back panel, etc.) of the OLED display device according to embodiments of the invention, and therefore, the other structures can be the existing structures. For example, a substrate, a driving circuit formed on the substrate, a circuit protective layer and so on may be included in the back panel of the OLED display device according to embodiments of the invention; the stated substrate may be a glass substrate, a plastic substrate, a quartz substrate or the like. However, embodiments of the invention are not limited thereto. For example, a back panel of the invention may include a glass substrate on the bottom, and a driving circuit, a circuit protective layer and other structures formed on the glass substrate. In view of the fact that the barrier property to water and oxygen only by way of glass frit encapsulation is limited, there is proposed a scheme that a water/oxygen barrier layer is added to a light exiting side of an OLED luminescent layer in embodiments of the invention. Thus, the water/oxygen barrier property of the device is further enhanced, and lifetime of the OLED luminescent layer is improved.

In the OLED display device provided by embodiments of the invention, the light extraction layer is a thin film formed by evaporating an organic or inorganic material, its thickness may be in the range of 40 to 70 nm, and technologies known by those skilled in the art may be used for its composition and forming process. No limitation will be made by embodiments of the invention.

In an embodiment, the stated OLED display device further include an electrode disposed on a light exiting side of the OLED luminescent layer, and the water/oxygen barrier material may be located between the electrode and the light extraction layer.

In an embodiment, the water/oxygen barrier layer has a thickness in the range of 15 to 20 µm.

For a top-emission OLED display device, it is required that the water/oxygen barrier layer has a good light transmittance, and this will not result in too much light loss. In addition, because a metallic material with higher refractive index and extinction coefficient is usually used for a cathode of the top-emission OLED luminescent layer, this makes light rays easily be totally reflected at an interface with the metal cathode, and cause a great deal of light loss. Hence, in order to raise the light extracting efficiency of the luminescent layer, a material with a high refractive index may be chosen for the water/oxygen barrier layer. For example, $SiO_2$ nanoparticles may be uniformly dispersed in the water/oxygen barrier layer, so as to further raise the light extracting efficiency of the OLED luminescent layer and improve the color uniformity. Owing to existence of $SiO_2$ nanoparticles, as light rays exit, they will be scattered upon going through spherical $SiO_2$ nanoparticles. Thus, it is possible that the light extracting efficiency is raised and the color uniformity is improved (See FIG. 1, which is a schematic view illustrating scattering function of $SiO_2$ nanoparticles on light rays).

The average particle diameter of $SiO_2$ nanoparticles in the composition as stated in embodiments of the invention is smaller than or equal to 50 nm, such as, 30 nm. When the average particle diameter of the $SiO_2$ nanoparticles fall within this scope, it can be ensured that the composition as an organic water/oxygen barrier material can be formed into a film evenly and the light extracting efficiency is raised.

Embodiment 6

Figure 2:
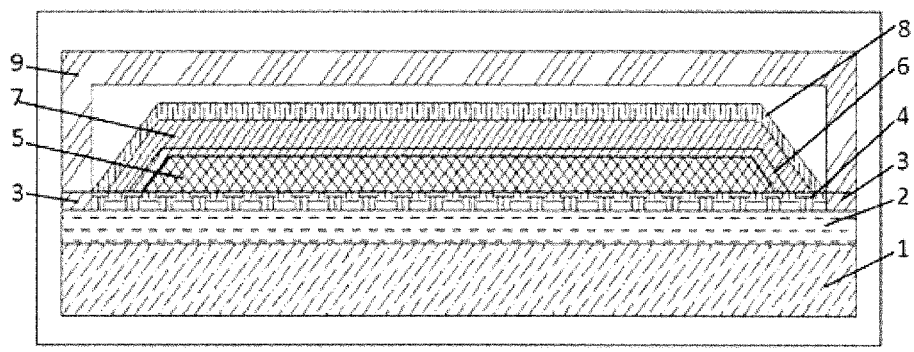
FIG. 2 is a structurally schematic view illustrating an OLED display panel provided by an embodiment the invention.

The present embodiment relates to an OLED display device, which includes the OLED display panel shown in FIG. 2, and the display panel includes a back panel 2, an anode ITO 4, an OLED luminescent layer 5, a metal cathode 6, a water/oxygen barrier layer 7, a light extraction layer 8 and a concave cover plate 9. The back panel 2 includes a glass substrate 1, and the glass substrate may also be a plastic substrate or a quartz substrate. The anode ITO 4 is located between the OLED luminescent layer 5 and the back panel 2, namely, underlying the OLED luminescent layer 5 (on top of the back panel), and the metal cathode 6 is located between the OLED luminescent layer 5 and the light extraction layer 8. The back panel 2 and the concave cover plate 9 are encapsulated by melting of a glass fit 3 to form a closed cavity, so that the OLED luminescent layer 5 as well as the anode ITO 4 and the metal cathode 6 is housed within the closed cavity. The light extraction layer 8 wraps over a surface of the OLED luminescent layer 5, and a water/oxygen barrier layer 7 located outside the metal cathode 6 is also provided between the OLED luminescent layer 5 and the light extraction layer 8.

In an example of the embodiment, the water/oxygen barrier layer 7 may be a water/oxygen barrier film, and its thickness is 15 μm; and, the water/oxygen barrier layer 7 is formed on the metal cathode by the composition useful as an organic water/oxygen barrier material as stated in Embodiment 1.

The cathode and anode in the embodiment are examples only, and not construed as a specific limitation to the protection scope of the invention.

Embodiment 7

According to the embodiment, there is provided an OLED display device. When it is compared to Embodiment 6, the difference merely lies in that, a water/oxygen barrier layer is formed by the composition useful as an organic water/oxygen barrier material as stated in Embodiment 2, and its thickness is 20 μm.

Embodiment 8

According to the embodiment, there is provided an OLED display device. When it is compared to Embodiment 6, the difference merely lies in that, a water/oxygen barrier layer is formed by the composition useful as an organic water/oxygen barrier material as stated in Embodiment 3, and its thickness is 16 μm.

Embodiment 9

According to the embodiment, there is provided an OLED display device.

When it is compared to Embodiment 6, the difference merely lies in that, a water/oxygen barrier layer is formed by the composition useful as an organic water/oxygen barrier material as stated in Embodiment 4, and its thickness is 18 μm.

Embodiment 10

According to the embodiment, there is provided an OLED display device. When it is compared to Embodiment 6, the difference merely lies in that, a water/oxygen barrier layer is formed by the composition useful as an organic water/oxygen barrier material as stated in Embodiment 5, and its thickness is 15 μm.

The OLED display device provided by embodiments of the invention has the following beneficial effects:

1) Water and oxygen can be prevented from entering a closed cavity with the aid of a good barrier property of all-glass encapsulation to water vapor and oxygen gas, and besides, a water/oxygen barrier layer is introduced by embodiments of the invention, so as to further impede entrance of water vapor and oxygen gas into an OLED luminescent layer, and the service life of the OLED display device is prolonged.

2) $SiO_2$ nanoparticles are further added to the water/oxygen barrier layer according to embodiments of the invention, so as to ensure high light outgoing efficiency and color uniformity.

3) As to the embodiments of the invention, the structure is simple, the production cost is low, and the effect of promoting water/oxygen barrier property is significant, thereby possessing an extremely high generalizability.

According to at least one embodiment of the invention, there is further provided a manufacturing method of an OLED display device, which includes that, an OLED luminescent layer is formed on a back panel; a water/oxygen barrier layer is formed on a light exiting side of the OLED luminescent layer; a light extraction layer is formed on a light exiting side of the water/oxygen barrier layer; and encapsulation is conducted.

In an embodiment, forming the water/oxygen barrier layer on the light exiting side of the OLED luminescent layer may include that, the composition is coated or deposited on a surface of the OLED luminescent layer; and the composition is cured.

It can be understood by those skilled in the art that, when a water/oxygen barrier layer is formed on a light exiting side of the OLED luminescent layer by the above composition, coating, deposition or other way can be adopted, but embodiments of the invention are not limited thereto, as long as a water/oxygen barrier layer possessing a good water/oxygen barrier property can be formed by the adopted way.

For example, when a water/oxygen barrier film on a light exiting side of the OLED luminescent layer is formed by the above organic water/oxygen barrier material, the way of uniform coating can be adopted. A technology known by those skilled in the art can be used for the uniform coating, and embodiments of the invention are not limited thereto.

In various embodiments, the curing may be conducted by way of drying, heating or the like. However, embodiments of the invention are not limited thereto.

In an embodiment, the light extraction layer may have a thickness in the range of 40 to 70 nm, it is a thin film formed by evaporating an organic or inorganic material, and technologies known by those skilled in the art may be used for its composition and forming process. No limitation will be made by embodiments of the invention.

Embodiment 11

The manufacturing method of the OLED display device as stated in Embodiment 6 may include the steps as stated below.

(1) An OLED luminescent layer to be encapsulated is formed on a back panel.

(2) Raw materials for preparing the composition useful as an organic water/oxygen barrier material (except for $SiO_2$ nanoparticles) are mixed intimately and stirred in a mixer for 40 min, $SiO_2$ nanoparticles are added therein, and they are stirred and mixed intimately.

(3) The composition obtained by the step (2) is coated evenly on a light exiting side of the OLED luminescent layer by way of spin coating, so as to form a water/oxygen barrier film. Other way to form a water/oxygen barrier layer (for example, including but not limited to deposition) is also suitable for embodiments of the invention, as long as a water/oxygen barrier film can be formed by this way.

(4) After the step (3) is finished, the back panel is placed in a vacuum baking oven at 80° C. for 30 min, and a water/oxygen barrier layer with a thickness of about 15 μm is formed after the water/oxygen barrier film is dried. Other curing way (for example, including but not limited to other drying way, other heating way or the like) is also suitable for embodiments of the invention, as long as a water/oxygen barrier layer can be formed by this way.

(5) After the step (4) is finished, a light extraction layer with a thickness of 50 nm is fabricated.

(6) A glass frit is coated on a cover plate, and after it is cell-aligned with the back panel, a laser irradiation is carried out to complete the encapsulation.

Embodiment 12

The manufacturing method of the display device as stated in Embodiment 7 may include the steps as stated below.

(1) An OLED luminescent layer to be encapsulated is formed on a back panel, for use.

(2) Raw materials for preparing the composition useful as an organic water/oxygen barrier material (except for $SiO_2$ nanoparticles) are mixed intimately and stirred in a mixer for 30 min, $SiO_2$ nanoparticles are added therein, and they are stirred and mixed intimately.

(3) The composition obtained by the step (2) is coated evenly on a light exiting side of the OLED luminescent layer by way of spin coating, so as to form a water/oxygen barrier film.

(4) After the step (3) is finished, the back panel is placed in a vacuum baking oven at 90° C. for 20 min, and a water/oxygen barrier layer with a thickness of about 20 μm is formed after the water/oxygen barrier film is dried.

(5) After the step (4) is finished, a light extraction layer with a thickness of 70 nm is fabricated.

(6) A glass frit is coated on a cover plate, and after it is cell-aligned with the back panel, a laser irradiation is carried out to complete the encapsulation.

Embodiment 13

The manufacturing method of the display device as stated in Embodiment 8 may include the steps as stated below.

(1) An OLED luminescent layer to be encapsulated is formed on a back panel, for use.

(2) Raw materials for preparing the composition useful as an organic water/oxygen barrier material (except for $SiO_2$ nanoparticles) are mixed intimately and stirred in a mixer for 60 min, $SiO_2$ nanoparticles are added therein, and they are stirred and mixed intimately.

(3) The composition obtained by the step (2) is coated evenly on a light exiting side of the OLED luminescent layer by way of spin coating, so as to form a water/oxygen barrier film.

(4) After the step (3) is finished, the back panel is placed in a vacuum baking oven at 70° C. for 40 min, and a water/oxygen barrier layer with a thickness of about 16 μm is formed after the water/oxygen barrier film is dried.

(5) After the step (4) is finished, a light extraction layer with a thickness of 60 nm is fabricated.

(6) A glass frit is coated on a cover plate, and after it is cell-aligned with the back panel, a laser irradiation is carried out to complete the encapsulation.

Embodiment 14

The manufacturing method of the display device as stated in Embodiment 9 may include the steps as stated below.

(1) An OLED luminescent layer to be encapsulated is formed on a back panel, for use.

(2) Raw materials for preparing the composition useful as an organic water/oxygen barrier material (except for $SiO_2$ nanoparticles) are mixed intimately and stirred in a mixer for 50 min, $SiO_2$ nanoparticles are added therein, and they are stirred and mixed intimately.

(3) The composition obtained by the step (2) is coated evenly on a light exiting side of the OLED luminescent layer by way of spin coating, so as to form a water/oxygen barrier film.

(4) After the step (3) is finished, the back panel is placed in a vacuum baking oven at 70° C. for 40 min, and a water/oxygen barrier layer with a thickness of about 18 μm is formed after the water/oxygen barrier film is dried.

(5) After the step (4) is finished, a light extraction layer with a thickness of 40 nm is fabricated.

(6) A glass frit is coated on a cover plate, and after it is cell-aligned with the back panel, a laser irradiation is carried out to complete the encapsulation.

Embodiment 15

The manufacturing method of the display device as stated in Embodiment 10 may include the steps as stated below.

(1) An OLED luminescent layer to be encapsulated is formed on a back panel, for use.

(2) Raw materials for preparing the composition useful as an organic water/oxygen barrier material are mixed intimately and stirred in a mixer for 40 min, so that they are stirred and mixed intimately.

(3) The composition obtained by the step (2) is coated evenly on a light exiting side of the OLED luminescent layer by way of spin coating, so as to form a water/oxygen barrier film.

(4) After the step (3) is finished, the back panel is placed in a vacuum baking oven at 80° C. for 30 min, and a water/oxygen barrier layer with a thickness of about 15 μm is formed after the water/oxygen barrier film is dried.

(5) After the step (4) is finished, a light extraction layer with a thickness of 50 nm is fabricated.

(6) A glass frit is coated on a cover plate, and after it is cell-aligned with the back panel, a laser irradiation is carried out to complete the encapsulation.

In the aforementioned manufacturing methods, the following points need to be noticed.

1) The water/oxygen barrier layer may be situated outside a metal electrode (e.g. a cathode), and located inside the light extraction layer. If the water/oxygen barrier layer is located outside the light extraction layer, then a total reflection may occur and the light exiting efficiency is reduced.

2) It is required that the water/oxygen barrier layer is formed firstly, and then the glass frit encapsulation is carried out. These two steps cannot be performed simultaneously.

3) When the glass frit encapsulation is carried out, laser is prevented from irradiating onto the water/oxygen barrier layer, so as to avoid damage of laser to the water/oxygen barrier layer.

4) The added amount of $SiO_2$ nanoparticles should not be excessive, otherwise, formation of the water/oxygen barrier layer will be affected and the water/oxygen barrier characteristic of the water/oxygen barrier layer will be degraded.

5) The particle diameter of $SiO_2$ nanoparticles may be smaller than or equal to 50 nm, and a particle diameter being too big may have an impact on formation and water/oxygen barrier property of the water/oxygen barrier layer.

Test Case 1

Test Subjects:

Device I

The device I is manufactured by the method as stated in Embodiment 11.

Device II (1) An OLED luminescent layer is formed on a back panel, for use.

(2) After the step (1) is finished, a light extraction layer with a thickness of 50 nm is directly fabricated.

(3) A glass frit is coated on a cover plate, and after cell-aligning, laser irradiation is conducted to complete the encapsulation.

Test method: water transmittance and lifetime of the device I and the device II are tested by an accelerated aging test method well-known in the art, and characteristic differences between the devices are compared. The results are as follows.

Test Result II

|  | Device I | Device II |
|---|---|---|
| Water vapor transmittance (WVTR)/(g/m$^2$-day) | <10−6 | 10$^{-3}$~10$^{-5}$ |
| Lifetime (brightness percentage, test for 13 h) | 96% | 88% |

Test Result III

|  | Device I | Device II |
|---|---|---|
| brightness/(cd/m$^2$) (@ current 10 mA) | 6100 | 3400 |
| Current efficiency/(cd/A) | 55.1 | 46.8 |
| Color uniformity/(%) | 91 | 85 |
| Visible angle/(°) | 41 | 35 |

Figure 3:
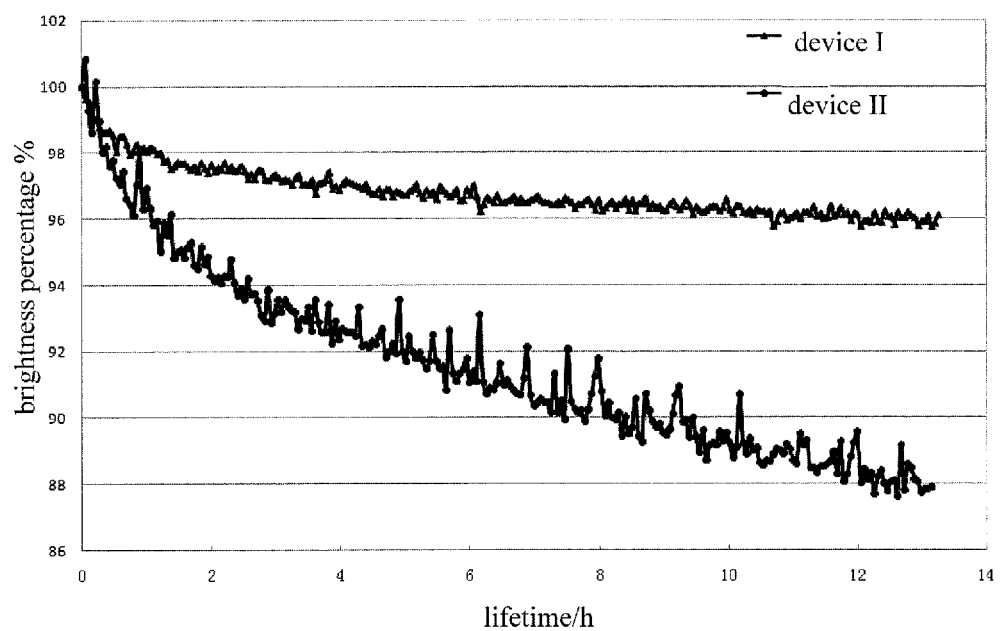
FIG. 3 is a schematic diagram illustrating test results of lifetime of two OLED display panels.

The test results show that, according to embodiments of the invention, by means of providing a water/oxygen barrier layer on a surface of an OLED luminescent layer except for its bottom surface tightly attached to a back panel, water vapor and oxygen gas in the display device can be effectively prevented from penetrating in the luminescent layer of OLED; an OLED display panel provided with a water/oxygen barrier layer has an effect of significantly delaying the aging of devices as compared with an OLED display panel not provided with a water/oxygen barrier layer (as shown in FIG. 3).

With respect to devices manufactured according to Embodiments 12 to 15 of the invention, test results similar to those for device I are obtained as well.

Implementation schemes in the above embodiments can be further combined or replaced, and embodiments are merely for description of preferred embodiments of the present invention, but are not used to limit the conception and scope of the invention. Without departing from the design idea of the present invention, various variances and improvements of technical schemes of the invention made by those skilled in the art belong to the protection scope of the present invention.

This application claims the benefit of priority from Chinese patent application No. 201410268704.7, filed on Jun. 16, 2014, the disclosure of which is incorporated herein in its entirety by reference as a part of the present application.

The invention claimed is:

1. A composition comprising:
   15-25 wt % of parylene,
   15-25 wt % of polyvinyl chloride,
   5-15 wt % of acetone,
   5-15 wt % of trichloroethylene,
   10-20 wt % of polyvinyl acetate,
   5-15 wt % of polyvinyl alcohol,
   0-5 wt % of SiO$_2$ nanoparticles, and
   8-12 wt % of an organic solvent,
   wherein all weight percent values are based on the total weight of he composition.

2. The composition claimed as claim 1, wherein the composition comprises 3 to 5 wt % of SiO$_2$ nanoparticles.

3. The composition claimed as claim 1, wherein the organic solvent is isopropanol or ethyl acetate.

4. The composition claimed as claim 1, wherein the average particle diameter of the SiO$_2$ nanoparticles is smaller than or equal to 50 nm.

5. An organic water/oxygen barrier material comprising the composition of claim 1.

6. An organic light-emitting diode (OLED) display device, comprising a water/oxygen baffler layer provided between an OLED luminescent layer and a light extraction layer, the water/oxygen barrier layer being formed by using the composition claimed as claim 1.

7. The OLED display device claimed as claim 6, further comprising an electrode disposed on a light exiting side of the OLED luminescent layer, the water/oxygen barrier layer being located between the electrode and the light extraction layer.

8. The OLED display device claimed as claim 6, wherein the water/oxygen barrier layer has a thickness in the range of 15 to 20 μm.

9. The organic water/oxygen barrier material claimed as claim 5, wherein the composition comprises 3 to 5 wt % of SiO$_2$ nanoparticles.

10. The organic water/oxygen barrier material claimed as claim 5, wherein the organic solvent is isopropanol or ethyl acetate.

11. The organic water/oxygen barrier material claimed as claim 5, wherein the average particle diameter of the SiO$_2$ nanoparticles is smaller than or equal to 50 nm.

12. The OLED display device claimed as claim 6, wherein the composition comprises 3 to 5 wt % of SiO$_2$ nanoparticles.

13. The OLED display device claimed as claim 6, wherein the organic solvent is isopropanol or ethyl acetate.

14. The OLED display device claimed as claim 6, wherein the average particle diameter of the SiO$_2$ nanoparticles is smaller than or equal to 50 nm.

15. A method for manufacturing an organic light-emitting diode (OLED) display device, comprising:
   forming an OLED luminescent layer on a back panel;
   forming a water/oxygen barrier layer on a light exiting side of the OLED luminescent layer, wherein, the water/oxygen barrier layer is formed by using the composition comprising: 15-25 wt % of parylene, 15-25 wt % of polyvinyl chloride, 5-15 wt % of acetone, 5-15 wt % of trichloroethylene, 10-20 wt % of polyvinyl acetate, 5-15 wt % of polyvinyl alcohol, 0-5 wt % of SiO$_2$ nanoparticles, and 8-12 wt % of an organic solvent, wherein all weight percent values are based on the total weight of the composition
   forming a light extraction layer on a light exiting side of the water/oxygen barrier layer; and
   performing encapsulation.

16. The manufacturing method claimed as claim 15, wherein forming the water/oxygen barrier layer on the light exiting side of the OLED luminescent layer includes:
   coating or depositing the composition on a surface of the OLED luminescent layer;
   curing the composition.

17. The manufacturing method claimed as claim 16, wherein the curing is performed by way of drying or heating.

18. The method claimed as claim 15, wherein the composition comprises 3 to 6 wt % of $SiO_2$ nanoparticles.

19. The method claimed as claim 15, wherein the organic solvent is isopropanol or ethyl acetate.

20. The method claimed as claim 15, wherein the average particle diameter of the $SiO_2$ nanoparticles is smaller than or equal to 50 nm.

* * * * *